United States Patent [19]

Yamasita et al.

[11] Patent Number: 5,314,769
[45] Date of Patent: * May 24, 1994

[54] METHOD FOR PRODUCING COLOR FILTER

[75] Inventors: Yukio Yamasita, Yokohama; Haruyoshi Sato, Kawasaki; Toru Nakamura, Yokohama; Hitoshi Yuasa, Yokohama; Yutaka Otsuki, Yokohama, all of Japan

[73] Assignee: Nippon Oil Co., Ltd., Tokyo, Japan

[*] Notice: The portion of the term of this patent subsequent to May 25, 2010 has been disclaimed.

[21] Appl. No.: 872,612

[22] Filed: Apr. 22, 1992

[30] Foreign Application Priority Data

Apr. 25, 1991 [JP] Japan .................................. 3-95630
Apr. 26, 1991 [JP] Japan .................................. 3-97281

[51] Int. Cl.$^5$ .............................................. G03F 9/00
[52] U.S. Cl. ........................................ 430/7; 430/20; 430/142; 430/321; 430/324
[58] Field of Search .................. 430/7, 142, 324, 321, 430/20

[56] References Cited

U.S. PATENT DOCUMENTS 4,846,556  7/1989  Haneda ............................... 430/325
5,214,541  5/1993  Yamasita et al. ........................ 430/7
5,214,542  5/1993  Yamasita et al. ........................ 430/7

FOREIGN PATENT DOCUMENTS 63-210901  9/1988  Japan .

OTHER PUBLICATIONS

Hackh's Chemical Dictionary, 4th edition (1972), p. 473, right column, definition of "onuim".
Flagello, et al. "A Single Expose Double Develop (SEDD) Process for Self-aligned Lithographic Applications", (Sep. 1989), Microelectronic Engineering, 8226, Nos. 1-4, pp. 47-52.

Primary Examiner—Charles L. Bowers, Jr.
Assistant Examiner—Geraldine Letscher
Attorney, Agent, or Firm—Darby & Darby

[57] ABSTRACT

A method for producing a color filter involves (A) forming a photosensitive coating film on a transparent electrically conductive layer formed on a surface of a transparent substrate and exposing the photosensitive coating film through a mask having patterns of at least three different degrees of light transmittances; (B) developing and removing a photosensitive coating film region registering with one of the patterns of smallest and largest degrees of light transmittances for exposing the transparent electrically conductive layer and electrodepositing a colored coating on the exposed transparent electrically conductive layer for forming a colored layer thereon, operation of developing and removing the photosensitive coating film and electrodepositing the colored coating being repeated for the respective patterns of different degrees of light transmittances in sequence of difference in light transmittances to form different colored layers, respectively; and (C) selectively forming a metal layer on at least one exposed region of the transparent electrically conductive layer.

42 Claims, 2 Drawing Sheets

□ ···· 1
▨ ···· 2
▨ ···· 3
▨ ···· 4

□ ···· 5
▨ ···· 6
▨ ···· 7
▨ ···· 8

METHOD FOR PRODUCING COLOR FILTER

BACKGROUND OF THE INVENTION

This invention relates to a method for producing a color filter and more particularly to a color filter advantageously employed as a color liquid crystal display device.

Among the currently employed methods for preparing a color filter, there are a dyeing method consisting in dyeing a transparent substrate with a binder containing dyes and pigments, a printing method and a pigment dispersion method.

Since the dyeing method consists in selectively forming a thin resin film on a substrate with dyes, a resist printing process and a photolithographic process need to be performed each time the color is changed. Although resist printing is unnecessary with the printing method, there is a limit to the refinement of color patterns and, the larger is the number of colors, the printing position becomes the worse. Although the fine color pattern is possible with the pigment dispersion method, a high precision photolithographic process needs to be performed each time the color is changed, resulting in a complicated process.

For overcoming the deficiency, there is proposed in Japanese Laid-open Patent Application No. 59-114572 (1984) a method for producing a color filter by an electrodeposition coating method. With this method, a transparent electrode is prepared by patterning a transparent electrically conductive film deposited on the substrate, and electrical voltage is applied only to a portion of the patterned transparent electrode which is to be dyed in the same color. The substrate is immersed in a colored electrodeposition bath for forming a colored layer by electrodeposition. Electric voltage is then applied only to a portion of the substrate which is to be dyed in a different color, and the substrate is then immersed in a colored electrodeposition bath for forming a different color layer by electrodeposition. However, it is necessary with this method to perform a high precision patterning of the transparent electrode, and to pay meticulous care during the subsequent process not to break the fine pattern, because otherwise the subsequent coloring process is rendered difficult. Besides, the patterned transparent electrode needs to be electrically continuous, even in fine pattern sections, so that limitations are imposed on the degree of freedom of the pattern shape.

In Japanese Laid-open Patent Application No. 63-210901 (1988), there is proposed a method consisting in forming colored layers by light exposure, development and electrodeposition, using a mask having patterns only in areas to be dyed in the same colors and a positive type photosensitive resin composition, and repeating the steps of light exposure, development and electrodeposition a desired number of times. This method is inferior in stability because it makes use of a compound containing unstable quinone diazido groups. Besides, if the quinone diazido compound is brought into contact with an aqueous alkali solution, the quinone diazido compound in the unexposed part is also reacted with an aqueous alkali solution so that photosensitivity is markedly changed to present difficulties in the subsequent light exposure and development steps.

On the other hand, in order to meet the demand for high performance of the device provided with a color filter, it has been desired to improve contrast and to prevent color purity from being lowered. In order to solve this problem, a method of forming a non-light transmitting film in a region of the color filter defined between neighboring pixels has been proposed. For forming the non-light transmitting film, there are known a method comprising forming pixels with alignment on a substrate on which a non-light transmitting film pattern is formed previously, and a method comprising forming a non-light transmitting film pattern with alignment on a substrate on which a pixel pattern is formed previously.

However, since it is necessary with these methods to effect an alignment operation between the pixel pattern and the non-light transmitting pattern, it is difficult with this precision to form a pattern of non-light transmitting pattern of a coincident size free of the light transmitting sections between the pixel patterns. It overlapped portions are produced, step differences are produced on a color filter, so that it becomes difficult to produce a color filter excellent in planarity.

With any of the above methods, high precision processing is required for alignment so that it is difficult to cope with the demand for a larger work size, that is a larger picture size with reduced costs.

SUMMARY OF THE INVENTION

It is a principal object of the present invention to provide a method for producing a color filter which is not in need of high precision fine processing and which has a large degree of freedom in selecting the pattern contour of the colored layers and non-light transmitting layers can be arrayed without gaps between the color filter pixels.

It is another object of the present invention to provide a method for preparing a color filter which can be adapted easily for larger picture size and which can be mass-produced easily.

The above and other objects of the invention will become apparent from the following description.

The present invention provides a method for producing a color filter comprising the steps of:

(A) forming a photosensitive coating film on a transparent electrically conductive layer formed on a surface of a transparent substrate and exposing the photosensitive coating film through a mask having patterns of at least three different degrees of light transmittances;

(B) developing and removing a photosensitive coating film region registering with one of the patterns of smallest and largest degrees of light transmittances for exposing the transparent electrically conductive layer and electrodepositing a colored coating on the exposed transparent electrically conductive layer for forming a colored layer thereon, operation of developing and removing the photosensitive coating film and electrodepositing the colored coating being repeated for the respective patterns of different degrees of light transmittances in sequence of difference in light transmittances to form different colored layers, respectively; and (C) selectively forming a metal layer on at least one exposed region of the transparent electrically conductive layer.

PREFERRED EMBODIMENTS OF THE INVENTION

Figure 1:
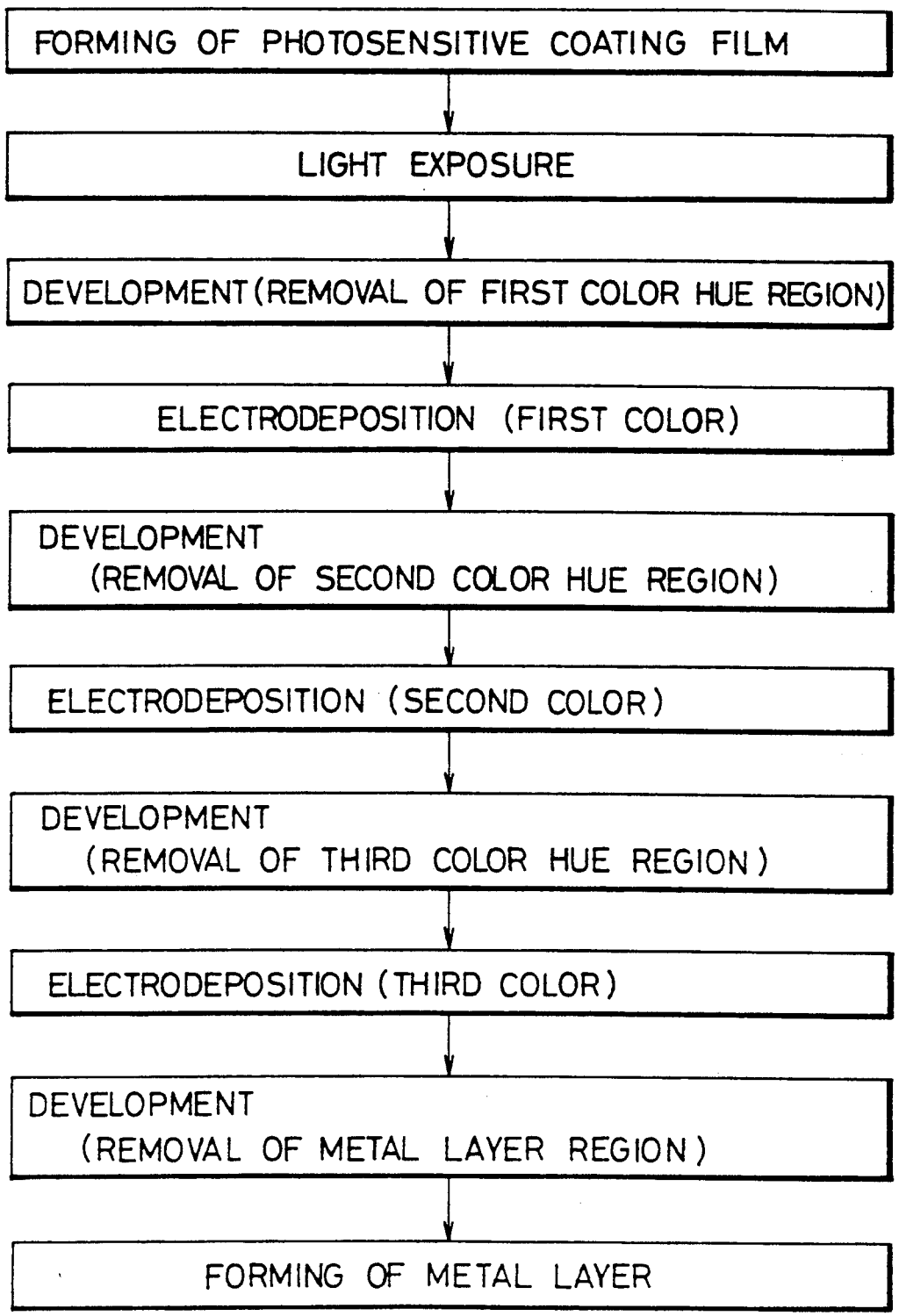
FIG. 1 is a diagram showing step by step a process for producing a color filter according to an embodiment of the present invention.

The present invention will be explained in more detail hereinbelow.

According to the present invention, a photosensitive coating film is formed on a transparent substrate having a transparent electrically conductive layer on its surface, and light exposure is performed via a mask having patterns of at least three different degrees of light transmittances (the step is referred to hereinafter as step A).

There is no particular limitation to the transparent substrate having a transparent electrically conductive layer, if the substrate is a transparent plate having an electrically conductive layer on its surface. Examples of the substrate may include a glass plate or a plate of transparent plastics having a transparent electrically conductive layer on its surface. The substrate preferably has a smooth surface in view of the performance desired of a color filter. The surface of the substrate may be ground if so required.

The electrically conductive layer may be formed of such materials as tin oxide, indium oxide, antimony oxide and mixtures thereof. There is no particular limitation to the methods for forming an electrically conductive layer and any of the known methods such as spraying chemical vapor deposition (CVD), sputtering or vacuum evaporation, may be employed. A commercially available transparent substrate having a transparent electrically conductive layer may be employed. The substrate is preferably of higher transparency in view of the performance desired of the color filter.

Although there is no particular limitation to the method of forming the photosensitive coating film on the transparent electrically conductive layer formed on the transparent substrate, a negative or positive type photosensitive coating may be applied on the substrate by the known methods, such as electrodeposition, spraying, dip coating, roll coating, screen printing or spin coating.

As the negative type photosensitive coating for forming the negative type photosensitive coating film, a negative type photosensitive coating resin exhibiting film forming capabilities and photosensitivity and a photopolymerization initiator may be dispersed or dissolved in a solvent such as an organic solvent or water so as to be used as a coating material. As the positive type photosensitive coating for forming the positive type photosensitive coating film, a positive type photosensitive coating resin exhibiting film coating capabilities and photosensitivity may be dispersed or dissolved in water or in an organic solvent so as to be used as a coating material. Dyes and/or pigments may be contained in the negative or positive type coatings.

The negative type photosensitive coating resin preferably employed in the present invention may include a prepolymer having photosensitive groups such as (meth)acryloyl groups, e.g. acryloyl or methacryloyl group, cinnamoyl groups or mixtures thereof at a terminal and/or side chain of the molecule, an onium group-containing cationic resin or a carboxylic group-containing anionic resin. The negative type photosensitive coating resin may have a molecular weight ranging between 500 and 10,000.

The prepolymer may preferably be formed from epoxy (meth)acrylate, urethane (meth)acrylate, polyester (meth)acrylate, or mixtures thereof.

The onium group-containing cationic resins may be composed of a main resin, such as acrylic resin, polyester resin, maleinated oil resin, polybutadiene resin, epoxy resin, urethane resin, polyamide resin or mixtures thereof, and the photosensitive groups and onium groups, such as amino group, ammonium group, sulfonium group or mixtures thereof, introduced therein. These resins may preferably be processed with an acidic substance such as formic acid, acetic acid, propionic acid, lactic acid or mixtures thereof, and solubilized and/or dispersed in water.

The carboxyl group-containing anionic resins may be composed of the above mentioned main resin into which carboxylic groups and the aforementioned photosensitive groups are introduced. These resins may preferably be solubilized and/or dispersed in basic substances, such as triethylamine, diethylamine, dimethylethanol amine, ammonia or mixtures thereof.

There is no particular limitation to the positive type photosensitive coating resin, if it is dissolved in a developing solution on light exposure, and may be enumerated by resins including quinone diazido groups, resins including diazomeldrum's acid or nitrobenzyl ester, or resin compositions including these resins. Specific examples of these resins include a quinone diazido group-containing cationic resin in which the onium groups and hydroxyl groups are introduced into the above main resins, to which a quinone diazido sulfonic acid compound is added further by esterification reaction followed by being processed with an acidic substance such as formic acid, acetic acid, propionic acid, lactic acid or mixtures thereof and solubilized and/or dispersed in water; a quinone diazido group-containing anionic resin in which carboxyl groups and hydroxyl groups are introduced into the above mentioned main resins, to which a quinone diazido sulfonic acid compound is further added by an esterification reaction followed by being processed with basic substances e.g. triethylamine, diethylamine, dimethylethanol amine, ammonia or mixtures thereof, and sulubilized and/or dispersed in water; a quinone diazido group-containing resin obtained by reacting a resin having film-forming capability and a hydroxyl group-compound with a quinone diazido compound including a quinone diazido sulfonic acid derivative or an isocyanate group; and resin compositions containing these resins. The mixing ratio for the resin compositions may be optionally selected depending on light exposure and development conditions.

As the negative type photosensitive coating resin and the positive type photosensitive coating resin, prepolymers or resins that may be solubilized and/or dispersed in water are most preferred for simplifying the process and combating the pollution.

The negative type photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol-di(meth)acrylate, trimethylolpropane triacrylate, pentaerythritol triacrylate, dipentaerythritol hexacrylate, tris(acryloyl oxyethyl) isocyanurate, and mixtures thereof. The proportion of these (meth) acrylates is preferably up to 50 and most preferably up to 30 parts by weight to 100 parts by weight of the negative type photosensitive coating resin. If the proportion of the (meth)acrylates exceeds 50 parts by weight, the coating becomes undesirably tacky.

The photopolymerization initiator employed in the negative type photosensitive coating may be any of those known in the art and may be enumerated by benzoins, benzoin ethers, benzylalkyl ketals, benzophenone derivatives, anthraquinone derivatives, thioxanthone derivatives or mixtures thereof. Sensitizers may be added thereto if so desired. The photopolymerization initiator may be added in an amount of 0.1 to 30 and preferably 0.5 to 20 parts by weight to 100 parts by weight of the negative type photosensitive coating resin. If the amount of the initiator is less than 0.1 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the negative and positive type photosensitive coating resins may be any of those capable of dispersing or dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether or triethyleneglycol dimethyl ether; ketones such as acetone, methylethyl ketone, methylisobutyl ketone, cyclohexanone or isophorone; ethers such as dibutyl ether, dioxane or tetrahydrofuran; alcohols such as methoxy butanol, diacetone alcohol, butanol or isopropanol; hydrocarbons such as toluene, xylene or hexane; esters such as ethyl acetate, butyl acetate, 2-methoxyethyl acetate, 2-methoxypropyl acetate or ethyl benzoate; acid amides such as dimethyl formamide, N,N-dimethyl acetoamide or dimethyl sulfoxide, and mixtures thereof.

These organic solvents may be added during solubilization or dispersion in water of the above mentioned cationic or anionic resins for improving bath stability or smoothing coating films.

The dyes and/or the pigments are preferably so selected as not to lower the stability and occasionally electrodeposition properties as well as durability of the coating. For this reason, oil soluble or dispersible dyes, such as azo, anthraquinone, benzodifuranone, condensed methine series dyes, or mixtures thereof, are preferred. The pigments may be exemplified by organic pigments, such as azo lake organic pigments, quinacridone organic pigments, phthalocyanine organic pigments, isoindolinone organic pigments, anthraquinone organic pigments or thioindigo organic pigments; chrome yellow, iron oxide, chrome vermilion, chrome green, ultramarine, prussian blue, cobalt blue, cobalt green, emerald green, titanium white, carbon black or mixtures thereof. As for the color hue of the dyes and pigments, reference is had to "COLOUR INDEX" whenever necessity arises.

The amount of the dyes and/or the pigments is suitably selected depending on the application, color hue, the type of the dyes and/or the pigments or the film thickness of the photosensitive coating. The amount may preferably be 3 to 70 wt. % and more preferably 5 to 60 wt. % based on the total photosensitive coating.

Depending on the type and the amounts of the dyes and/or pigments, the produced coating film may be rendered light transmitting or light intercepting according to the intended applications. For example, black tinted light-intercepting coating film may be produced by using 3 to 34 wt. % of carbon black, as pigments, based on the total amount of the negative or positive type photosensitive coating. The black-hued light-intercepting coating film is particularly desirable for preventing light leakage. The color hue of the dyes and/or the pigments may include white color hue. The dyes and/or the pigments are preferably purified for removing impurities. The photosensitive coating may be admixed with various assistant agents, such as dispersants for the dyes and/or the pigments, levelling agents for improving smoothness of the coating film, viscosity adjustment agents or defoaming agents.

For producing the negative type photosensitive coating, the negative type photosensitive coating resins, the photopolymerization initiator and the solvent are sufficiently dispersed, using a dispersion apparatus, such as customary sand mills, roll mills or attriters. The positive type photosensitive coating may be prepared by mixing and dispersing the resins for the positive type photosensitive coating and the solvent in the same manner as for the negative type coating. The dyes, pigments, acidic or basic substances, dispersants, levelling agents for improving smoothness of the coating film, viscosity adjustment agents or defoaming agents may be mixed and dispersed as needed. There is no limitation to the film thickness of the photosensitive coating films formed by the photosensitive coating and the film thickness may be suitably selected depending on the performance desired of the color filter. The dry film thickness may be usually 0.3 to 5 $\mu$m and preferably 1 to 3 $\mu$m. The film thickness may be adjusted by controlling, for example electrodeposition conditions, such as voltage, electrodeposition time and bath temperature. However, film thickness adjustment may be usually made under the same conditions as those for electrodeposition coating of colored coatings, as will be explained subsequently.

According to the present invention, exposure of the photosensitive coating film is to be performed by using a mask having patterns of at least three different degrees of light transmittances. The light transmittance means an intensity ratio before and after transmission of the exposure light through the mask. At least three different light transmittance degrees of the mask patterns will suffice depending on the number of types of the colored coatings. The difference in the light transmittance degrees may be optionally determined depending on the conditions of light exposure and development. In general, the larger the relative difference in the respective light transmittances, the easier becomes the adjustment of light exposure time, which is more desirable. However, even if the difference in the light transmittances is small, the same objective may be achieved by enhancing the volume of light exposure or prolonging the light exposure time. Thus, a significant difference of 5% or more is desirable, although no limitations are placed on the relative difference in the light transmittances.

Light exposure may be usually achieved using a system radiating a large quantity of ultraviolet rays. For example, a high pressure mercury lamp, an ultra high pressure mercury lamp or a metal halide lamp may be used as a light source. If necessary, other radiation rays may also be employed. Light exposure conditions may be selected suitably depending on photosensitive coatings employed, light exposure devices and masks.

In the step A of the present invention, by effecting light exposure through a mask having patterns of at least three different degrees of light transmittances, a number of different exposure states which is the same as that of the different light transmittance degrees of the patterns may be provided in the photosensitive coating film.

In the method of the present invention, the step of forming a colored layer by applying a colored coating by electrodeposition on the transparent electrically conductive layer exposed after developing and removing the photosensitive coating film is repeated, next to the step A, in the order of the increasing light transmittance degrees of the patterns with use of the negative type photosensitive coating and in the order of the decreasing light transmittance degrees of the patterns with use of the positive type photosensitive coating, for producing the respective colored layers. That is, if the negative type photosensitive coating is employed, the portion of the photosensitive coating film corresponding to a pattern of the smallest degree of light transmittance of the patterns is selectively developed and removed, and the colored coating is electrodeposited on the exposed transparent electrically conductive layer to form a colored layer (step B). The portion of the coating film corresponding to the second smallest light transmittance degree of the patterns is then selectively developed and removed and the colored coating is electrodeposited on the exposed electrically conductive layer to form a colored layer. This sequence of operations is repeated to produce the colored layers, respectively (step B). If the positive type photosensitive coating is employed, the portion of the photosensitive coating film corresponding to a pattern of the largest light transmittance of the mask is selectively developed and removed and a colored coating is electrodeposited on the exposed transparent electrically conductive layer to form a colored layer (step B). The portion of the coating film corresponding to the second largest light transmittance degree of the patterns is then selectively developed and removed and a colored coating is electrodeposited on the exposed electrically conductive layer to form a colored layer. This sequence is repeated to produce the respective colored layers (step B).

The conditions for selectively developing and removing the photosensitive coating film may be changed depending on the volume of light exposure, solubility of the photosensitive coating in the developing solution, the types and the concentrations of the developing solution, development time and temperatures. Thus, the conditions may be suitably selected for the resin used for the preparation of the photosensitive coating. Specifically, aqueous solutions containing dissolved acidic materials may be used as a developing solution when the cationic resin is used as a component of the negative photosensitive coating. The acidic materials include organic acids, such as formic acid, acetic acid, propionic acid or lactic acid; inorganic acids, such as hydrochloric acid or phosphoric acid; and mixtures thereof. If lactic acid is used as a developing solution, it may be used at a concentration usually of 0.01 to 50 wt. % and preferably 0.01 to 30 wt. %. The developing temperature is usually 10° to 70° C. and preferably 20° to 50° C. and the developing time is usually 5 to 600 seconds. As a developing solution in case of employing an anionic resin as a component of the negative type photosensitive coating and as a developing solution for the positive type photosensitive coating, an aqueous solution containing basic substances dissolved therein, may be employed. The basic substances may include sodium carbonate, sodium hydrogen carbonate, sodium metasilicate, tetraalkyl ammonium hydroxide, sodium hydroxide, potassium hydroxide and mixtures thereof. If an aqueous solution of sodium carbonate is used as a developing solution, sodium carbonate may be used in a concentration range of 0.01 to 25 wt. % and preferably 0.05 to 15 wt. % for development. The development time usually is selected within a range of 5 to 600 and preferably 5 to 300 seconds generally at 10° to 70° C. A developing solution when the positive type photosensitive coating is employed may usually be an aqueous solution in which a basic material is dissolved. The basic material includes sodium carbonate, sodium hydrogen carbonate, sodium metasilicate, tetraalkyl ammonium hydroxide, sodium hydroxide, potassium hydroxide and mixtures thereof. For example, where an aqueous solution of sodium metasilicate is employed as a developing solution, development may be effected at the concentration of sodium metasilicate of 0.01 to 25 wt. % and preferably 0.05 to 20 wt. %. The developing temperature may usually be 10° to 70° C. and preferably be 15° to 50° C. and the developing time may be 2 to 600 seconds and preferably 4 to 300 seconds. For the developing solutions, organic solvents such as alcohols, glycol ethers, ketones, chlorinated hydrocarbons or mixtures thereof, may be employed. Surfactants or defoaming agents may also be added to these developing solutions for improving wettability or anti-foaming properties. Aqueous developing solutions are preferably employed in view of non-toxicity and sanitation in working environments.

After the development, colored coatings are electrodeposited on the exposed transparent electrically conductive layer for forming a colored layer.

In preparing the colored coating, cationic resins, anionic resins or photocurable resins are used as a film-forming component, and dyes and/or pigments are added as a colorant component. Acidic or basic substances may also be employed for dissolving and/or dispersing these components in water. Organic solvents may be added for facilitating dissolution and/or dispersion of the resins in the colored producing smooth coating films.

The cationic resins may for example be resins composed of the main resins used in the photosensitive coating into which onium groups such as ammonium, sulfonium groups or amino groups are introduced, such as resins solubilized or dispersed in water with an acidic substance, such as formic acid, acetic acid, propionic acid, lactic acid or mixtures thereof.

The anionic resins may for example be resins composed of the main resins used in the photosensitive coating into which carboxyl groups, etc. are introduced, and may for example be resins solubilized or dispersed in water with basic substances such as triethylamine, diethylamine, dimethylethanol amine, ammonia or mixtures thereof.

As the photocurable resins, those prepolymers or resins containing acryloyl groups, methacryloyl groups, cinnamoyl groups or mixtures thereof, that are used in the photosensitive coating film in the step A and that are suited for electrodeposition, may be employed. The above mentioned photopolymerization initiators may also be employed in combination.

The colored coatings employed in step B may be different in type, color hue, color concentration or color brightness in the regions exhibiting different light transmittances. Alternatively, the same colored coatings may be used in common for these regions.

The dyes and/or pigments used in the colored coatings may be suitably selected depending on the targeted color hue. It is, however, preferred to use those dyes and/or pigments which are not unsatisfactory in transparency, stability, electrodeposition properties and durability of the coating film. Particularly preferred are those dyes or pigments which may be mixed as the occasion may demand in the above mentioned photosensitive coatings.

In the preparation of the colored coatings, resins, dyes and/or pigments, acidic or basic substances, organic solvents, dispersants for the dyes or pigments, levelling agents for improving smoothness of the coating films, viscosity controlling agents or anti-foaming agents are mixed together and dispersed sufficiently in a conventional dispersion device such as sand mill, roll mill or attriter. The resulting dispersion is diluted in water to a predetermined concentration of about 4 to 25 wt. % and preferably to 7 to 20 wt. % of solid content to produce a coating suitable for electrodeposition. The so-produced coating may be applied on the electrically conductive layer by electrodeposition for providing a colored layer.

There is no particular limitation to the film thickness of the colored layer, which may be suitably selected depending on the performance required of a color filter. However, the dry thickness is usually 0.3 to 5 $\mu$m and preferably 1 to 3 $\mu$m.

Although the conditions of electrodeposition may be suitably selected depending on the types of the colored coatings and film thickness of the colored coating films, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15° to 30° C. After lapse of the electrodeposition time sufficient to produce a desired film thickness, current conduction is discontinued and the substrate is taken out of the bath. The substrate is freed of excess bath liquid by washing with water and dried to produce the colored layer.

Although the drying conditions may be selected suitably depending on the conditions of the subsequent process steps, it is usually preferred that the conditions be such that surface moisture is dried, for example, the drying time be of the order of 1 to 20 minutes and preferably 2 to 10 minutes at a temperature of 120° C. or lower and preferably 30° to 100° C. If the drying temperature is higher than 120° C., the photosensitive coating film is occasionally cured under heat to raise difficulties in the subsequent development process.

In the process of the present invention, the step C of selectively forming a metal layer on at least one exposed region of the transparent electrically conductive layer is carried out next to the step B. Preferably, in the step C, the metal layer may selectively be formed on an exposed region registering with that portion other than the patterns of different degrees of light transmittances of the mask.

The metal layer may be formed by developing and removing the photosensitive coating film registering with at least one of the patterns of different degrees of light transmittances and/or registering with that portion other than the patterns remaining on the substrate followed by processing the exposed electrically conductive layer by electroplating or non-electroplating method. Such processing may be suitably selected using a variety of commonly used plating solutions and processing conditions selected from the ordinary processing conditions in confirmity with the performance required of the color filter.

Among metals that may be used for a metal layer, there are metal materials that may be processed by plating, such as metals, e.g. copper, nickel, chromium, silver and gold, alloys of two or more of these metal materials, and metals obtained by mixing two or more of the metal materials in a plating bath. The thickness of the metal layer may be selected suitably depending on the performance required of the color filter, and may preferably be of the order of 10 nm to 5 $\mu$m and preferably 10 nm to 3 $\mu$m. The color filter may be made planar if the metal layer is of a thickness substantially equal to that of the colored layers.

With the method of the present invention, since in the aforementioned step C the metal layer may be formed by, for example plating on a region of the electrically conductive layer selectively exposed, so that the metal layer may be formed in a self-aligned manner between the regions or gaps between the colored layers. With such color filter, not only the contrast and color purity are improved, but also the function as an electrode sub-line may be fulfiled, so that signal delay in large screen desplay or heating within the cell may be diminished.

Although the desired color filter may be produced by the above described steps (A), (B) and (C), heating, curing or photocuring may be effected, if needed, for further improving weatherability or resistance to chemicals. If heating or curing is effected, the temperature is usually 100° to 250° C. and preferably 150° to 250° C. and the processing time is usually 5 minutes to one hour and preferably 15 to 40 minutes.

The process according to an embodiment of the present invention will be hereinafter explained by referring to FIGS. 1 to 3. It should be noted that the present invention is not limited to this merely illustrative embodiment.

Figure 2:
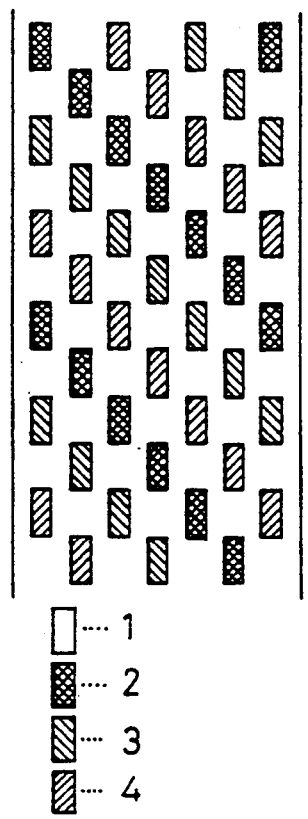
FIG. 2 is an enlarged schematic view showing a mask employed in Examples 1-1, 1-2 and 1-3 of the invention.

Referring first to FIGS. 1 and 2, the present process will be explained for a case in which a negative type photosensitive resin is used as a photosensitive resin.

FIG. 1 shows one embodiment of the present process step by step and FIG. 2 shows, in an enlarged schematic view, a mask having four different degrees of light transmittances according to an embodiment of the present invention, wherein 1 is a mask region having a 100% light transmittance corresponding to a light-intercepting film, 2 is a mask region having a 5% light transmittance corresponding to a first color region, 3 is a 25% light transmittance mask region corresponding to a second color region and 4 is a 80% light transmittance mask region corresponding to a third color region.

First, a photosensitive coating film is formed on a transparent electrically conductive layer formed on the surface of a transparent substrate. The substrate is then dried and exposed to light through the mask shown in FIG. 2. A first development operation is then performed for exposing or laying to outside a region of the electrically conductive layer which is in register with the 5% transmittance mask region 2 and which corresponds to the first color region. The substrate is then dipped in an electrodeposition bath containing a first colored coating for electrodeposition coating followed by washing with water.

A second development operation is then carried out under conditions different from those employed in the first development operation, for exposing or laying to outside a region of the electrically conductive layer which is in register with the 25% light transmittance mask region 3 and which corresponds to the second color region. The substrate is then dipped in an electrodeposition bath containing a second colored coating for electrodeposition coating followed by washing with water.

A third developing operation is then carried out under conditions different from those employed in the first or second developing operations for exposing or laying to outside a region of the electrically conductive layer which is in register with the 80% light transmittance mask region 4 and which corresponds to the third color region. The substrate is then subjected to electrodeposition coating in an electrodeposition bath containing a third colored coating followed by washing with water and drying for formings colored layer.

A fourth developing operation is then carried out under conditions different from those of the first to third developing operation, for exposing or laying to outside a region of the electrically conductive layer which is in register with the maximum transmittance mask region and which corresponds to the light-intercepting layer. A metal layer is then formed, such as by plating, for completing a color filter of the present invention.

Then, referring to FIGS. 1 and 3, the process of the present invention will be explained in connection with the use of a positive type photosensitive resin as a photosensitive resin.

Figure 3:
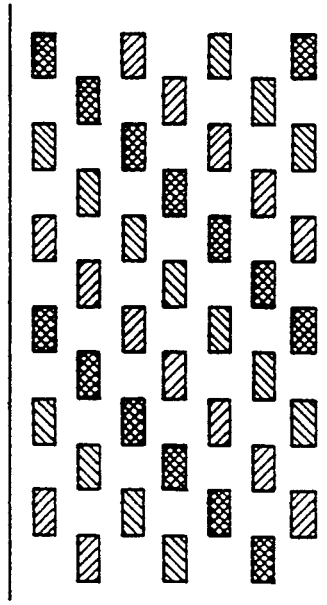
FIG. 3 is an enlarged schematic view showing a mask employed in Examples 2-1, 2-2 and 2-3 of the present invention.

FIG. 1 shows a process according to an embodiment of the present invention step by step and FIG. 3 shows, in an enlarged schematic view, a mask having four different degrees of light transmittance according to an embodiment of the present invention, wherein 5 is a mask region having a 1% light transmittance corresponding to a light-intercepting film region, 6 is a mask region having a 100% light transmittance corresponding to a first color region, 7 is a mask region having a 50% light transmittance corresponding to a second color region, and 8 is a mask region having a 25% light transmittance corresponding to a third color region.

First, a positive type photosensitive coating film is formed on a transparent electrically conductive layer formed on the surface of a transparent substrate, and the substrate is then dried. After light exposure through a mask such as that shown in FIG. 3, a first developing operation is carried out for exposing or laying to outside a region of the electrically conductive layer which is in register with the maximum light transmittance mask region 6 and which corresponds to the first color region. The substrate is then subjected to electrodeposition coating in an electrodeposition bath containing a first colored coating followed by washing with water.

A second developing operation is then carried out under conditions different from those of the first developing operation for exposing or laying to outside a region of the electrically conductive layer which is in register with the second highest light transmittance mask region 7 and which corresponds to the second color region. The substrate is then subjected to electrodeposition coating in an electrodeposition bath containing a second colored coating followed by washing with water.

A third developing operation is then carried out under conditions different from those of the first or second developing operations for exposing or laying to outside a region of the electrically conductive layer which is in register with the third highest light transmittance mask region 8 and which corresponds to the third color region. The substrate is then subjected to electrodeposition coating in an electrodepositing bath containing a third colored coating followed by washing with water.

A fourth developing operation is then carried out under conditions different from those of the first to third developing operations for exposing or laying to outside a region of the electrically conductive layer which is in register with the lowest light transmittance mask region and which corresponds to the light-intercepting film.

A metal layer is then formed, such as by plating, for producing a color filter of the present invention.

If the photosensitive coating is employed in the present invention, there may be preferably employed a method consisting in using a coating material obtained by dissolving and/or dispersing cationic resins in water, effecting coating by electrodeposition and forming colored layers with a colored coating prepared by using anionic resins, or conversely, a method consisting in using, as a photosensitive coating, a coating material obtained by dissolving and/or dispersing anionic resins in water and forming colored layers by using a colored coating prepared from cationic resins.

With the present method for producing a color filter, patterning may be achieved by one light exposure operation with an increased degree of freedom in the patterned shapes of the colored layers without the necessity of highly advanced fine processing techniques while increased color filter size can be coped with. Thus, the color filter may be mass-produced relatively easily.

EXAMPLES OF THE INVENTION

The present invention will be explained hereinbelow with reference to Synthesis Examples and Examples which are given only for illustration and are not intended for limiting the invention.

SYNTHESIS EXAMPLE 1

Synthesis of Photosensitive Resin (A-1)

Synthesis of Amine-added Expoxidated Polybutadiene (a-1)

1,000 g of epoxidated liquid polybutadiene, manufactured by NIPPON PETROCHEMICALS CO., LTD. under the trade name of "E-1000-8", with a number average molecular weight of 1,000 and an oxirane oxygen content of 8%, were charged into a 2 lit separable flask, fitted with a thermometer, stirrer and a reflux cooling pipe. After replacing the atmosphere within the system by nitrogen, 231.2 g of methylethanol amine were added and reaction was carried out at 170° C. for five hours. Non-reacted methylethanol amine was then distilled off under reduced pressure to produce amine-added epoxidated polybutadiene (a-1) with an amine value of 230.4 mmol/100 g.

Synthesis of Unsaturated Group-Containing Isocyanate Compound 435.5 g of 2,4-tolylene diisocyanate and 266.1 g of diethylene glycol dimethyl ether were charged into a 2 lit round-bottom flask, which may be heated and cooled and which was fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to dropwise addition of 2-hydroxyethyl acrylate, the system was occasionally cooled for maintaining the constant temperature. After the end of the dropwise addition of 2-hydroxyethyl acrylate, the temperature was raised to 70° C., at which temperature the reaction was carried out for three hours. After the IR absorption spectral analyses revealed that the absorption intensity of the isocyanate groups was decreased to about one half that before start of the reaction, the reaction system was cooled to produce an unsaturated group-containing isocyanate compound (a-2).

Synthesis of Photosensitive Resin (A-1)

500 g of (a-1) were dissolved in 166.7 g of diethylene glycol dimethyl ether in a 2 lit separable flask. 713.4 g of (a-2), in which isocyanate groups are contained in an amount of 0.8 equivalent to 1 equivalent of hydroxyl groups, were added dropwise at 40° C., at which temperature the reaction was carried out for one hour. The IR absorption spectral analyses indicated that the isocyanate groups had disappeared. A photosensitive resin (A-1), in which (a-2) was added to (a-1), was produced.

SYNTHESIS EXAMPLE 2

Synthesis of Polyamine (A-2) Solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone, were charged into 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g, was produced.

Then, 1,000 g of the maleinated polybutadiene and 433 g of ethylene glycol monobutyl ether were charged and uniformly dissolved in a 3 lit separable flask fitted with a reflux cooling pipe. 364.3 g of N,N-dimethyl amino propylamine were added dropwise over one hour, while the temperature of 135° C. was maintained under a nitrogen stream. After the same temperature was maintained for five hours, a polyamine solution containing tertiary amino groups and imido groups (A-2 solution) was produced. The produced polyamine (A-2 solution) contained 206 mmols of tertiary amines per 100 g of solution, with the non-volatile content amounting to 75.0 wt. %.

SYNTHESIS EXAMPLE 3

Synthesis of Half-Esterified Product (A-3) solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone were charged into 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g was produced.

Then, 1,000 g of the maleinated polybutadiene and 461.8 g of diethylene glycol dimethyl ether, 3.0 g of N,N-dimethyl benzyl amine and 385.5 g of benzyl alcohol were charged into a 3 lit flask fitted with a reflux cooling tube. After the mixture was dissolved uniformly, reaction was carried out under nitrogen at 120° C. for two hours to produce a half-esterified product (A-3) in solution. The total acid value of the produced half-esterified product (A-3) in solution was 109.3 mg KOH/g and the non-voltile content amounted to 75.0 wt. %.

SYNTHESIS EXAMPLE 4

Synthesis of Resin (A-4)

400 g of the maleinated polybutadiene obtained in Synthesis Example 3, 188.5 g of diethylene glycol dimethyl ether and 0.4 g of hydroquinone were charged into a 2 lit separable flask fitted with a reflux cooling tube. After the temperature was raised to 80° C., the mixture was agitated and homogenized. Then, 165.6 g of 2-hydroxyethyl acrylate and 20 g of triethylamine were added and reaction was carried out at the above temperature for two hours to produce a solution of a half-esterified product of the maleinated polybutadiene (A-4). The total acid value of the produced half-esterified product (A-4) solution was 105 mg KOH/g and the non-volatile content amounted to 75.0 wt. %.

SYNTHESIS EXAMPLE 5

Preparation of Photosensitive Coating (B-1)

To 500 g of the photosensitive resin (A-1) produced in Synthesis Example 1, were added, as photopolymerization initiators, 27.0 g of "IRGACURE 907", a product manufactured by CIBA GEIGY INC. and 3.0 g of "KAYACURE DETX", a product manufactured by NIPPON KAYAKU CO., LTD. under agitation and mixed together.

16.7 g of acetic acid, as a neutralizer, was added and the resulting mass was again agitated thoroughly and homogenized. As deionized water was added slowly, the reaction mass was mixed vigorously by a high speed mixer and dispersed in water to produce an aqueous solution of a cation electrodeposition type photosensitive coating (B-1) having a solid concentration of 15 wt. %.

SYNTHESIS EXAMPLE 6

Preparation of Photosensitive Coating (B-2)

To 500 g of the half-esterified product (A-4) produced in Synthesis Example 4, were added, as photopolymerization initiators, 27.0 g of "IRGACURE 907", a product manufactured by CIBA GEIGY INC. and 3.0 g of "KAYACURE DETX", a product manufactured by NIPPON KAYAKU CO., LTD. under agitation and mixed together.

33.7 g of triethylamine as a neutralizer was added and the resulting mass was again agitated thoroughly and homogenized. As deionized water was added slowly, the reaction mass was mixed vigorously by a high speed mixer and dispersed in water to produce an aqueous solution of an anion electrodeposition type photosensitive coating (B-2) having a solid concentration of 15 wt. %.

SYNTHESIS EXAMPLE 7

Preparation of Photosensitive Coating (B-3)

To 500 g of the photosensitive resin (A-1), produced in Synthesis Example 1, 27.0 g of "IRGACURE 907", a trade name of a product manufactured by CIBA GEIGY INC., and 3.0 g of "KAYACURE DETX", a trade name of a product manufactured by NIPPON KAYAKU CO., LTD. as photopolymerization initiators were added under agitation and mixed. The resulting mass was diluted with methylethyl ketone to give a solid content concentration of 40 wt % to produce a photosensitive coating solution (B-3).

SYNTHESIS EXAMPLE 8

Preparation of Colored Coatings (C-1, C-2 and C-3)

Each half ester (A-3) in solution and pigments were mixed together under agitation and dispersed by a laboratory 3-roll roll mill, manufactured by KODAIRA SEISAKUSHO KK, until the pigment particle size of not more than 0.3 μm was reached. The particle size was measured using a COULTER counter N4 (manufactured by COULTER INC.). To each of the so-produced dispersion mixtures, there was added triethylamine as a neutralizer, and each resulting mixture was again agitated thoroughly and homogenized. The resulting mass was dispersed in water under agitation vigorously by a high speed mixer while additing gradually deionized water, to prepare each of the colored coatings (C-1, C-2 and C-3) having solid concentrations of 10 wt. %. The compositions of the produced anionic electrodeposition type aqueous solutions of the produced three color coatings are shown in Table 1, wherein the numerical values denote parts by weight.

TABLE 1

| Coating No. Color | C-1 Red | C-2 Green | C-3 Blue |
|---|---|---|---|
| Half-Ester (A-3) Solution | 213.3 | 213.3 | 213.3 |
| Triethylaine (Neutralizer) | 21.0 | 21.0 | 21.0 |
| Ion-exchanged water | 1725.7 | 1725.7 | 1725.7 |
| Phthalocyanine Blue (*) | — | — | 20 |
| Phthalocyanine Green (**) | — | 20 | — |
| Azo Metal Salt Red Pigment (***) | 20 | — | — |

(*) SR-150C manufactured by SANYO SHIKISO KK
(**) SAX manufactured by SANYO SHIKISO KK
(***) Pigment Red 4BS manufactured by SANYO SHIKISO KK

SYNTHESIS EXAMPLE 9

Preparation of Colored Coatings (C-4, C-5 and C-6)

Polyamine (A-2) in solution and pigments were mixed together under agitation and dispersed by a laboratory 3-roll roll mill, manufactured by KODAIRA SEISAKUSHO KK, until the pigment particle size of not more than 0.3 μm was reached. The particle size was measured using a COULTER counter N4 (manufactured by COULTER INC.). To the so-produced dispersion mixtures, there was added acetic acid as a neutralizer, and the resulting mixture was again agitated thoroughly and homogenized. Each of the resulting masses was dispersed in water under gradual addition of deionized water and vigorous agitation by a high speed mixer to prepare colored coatings (C-4, C-5 and C-6) each having a solid concentration of 10 wt. %. The compositions of the produced cationinc electrodeposition type aqueous solutions of the three color coatings are shown in Table 2, wherein the numerical values denote parts by weight.

TABLE 2

| Coating No. Color | C-4 Red | C-5 Green | C-6 Blue |
|---|---|---|---|
| Polyamine (A-2) solution | 213.3 | 213.3 | 213.3 |
| Acetic acid (neutralizer) | 19.8 | 19.8 | 19.8 |
| Ion-exchanged water | 1726.9 | 1726.9 | 1726.9 |
| Pthalocyanine Blue (*) | — | — | 20 |
| Phthalocyanine Green (**) | — | 20 | — |
| Azo Metal Salt Red Pigment (***) | 20 | — | — |

(*) SR-150C manufactured by SANYO SHIKISO KK
(**) SAX manufactured by SANYO SHIKISO KK
(***) Pigment Red 4BS manufactured by SANYO SHIKISO KK

SYNTHESIS EXAMPLE 10

Synthesis of Cationic Positive Type Photosensitive Resin (A-5)

Synthesis of Unsaturated Compound (a-3)

148 parts of glycidol, 0.8 part of dibutyl tin dilaurylate, 0.2 part of hydroquinone monomethyl ether and 82 parts of 2-ethoxyethyl acetate were charged into a 1 lit separable flask fitted with a thermometer, an agitator, a reflux cooling tube, a gas inlet pipe and a dropping funnel, and the temperature was raised to 50° C. 319 parts of methacryloyloxyethyl isocyanate were added dropwise over an hour as air was blown into the system and reaction was carried out until absorption of the isocyanate groups in IR absorption spectrum substantially disappeared. 276 parts of 4-hydroxy benzoic acid were added, and the temperature was raised to 110° C. After it was confirmed that the acid value was not more than 5 and the epoxide equivalent weight was not less than 11,000, the reaction was discontinued to produce an unsaturated compound (a-3).

Synthesis of Cationic Positive Type Photosensitive Resin (A-5)

238 parts of diethylene glycol monoethyl ether were charged into a 1 lit separable flask fitted with a thermometer, an agitator, a reflux cooling tube and a dropping funnel, and the temperature was raised to 130° C. Into this mixture, a mixed solution composed of 145 parts of (a-3), 83 parts of isobutyl methacrylate, 167 parts of ethyl acrylate, 78 parts of ethyl methacrylate, 41 parts of dimethylaminoethyl methacrylate and 12 parts of t-butyl peroxy-2-ethyl hexanoate were added dropwise over three hours. After lapse of 30 minutes, a mixed solution of 25 parts of diethylene glycol monoethyl ether and 2 parts of t-butyl peroxy-2-ethyl hexanoate was added dropwise over 30 minutes. The resulting mass was maintained at this temperature for two hours to terminate the reaction. 500 parts of the produced acrylic resin solution were taken into a 3 lit separable flask fitted with a thermometer, an agitator, a reflux cooling tube, a nitrogen inlet pipe and a dropping funnel. Into this mixture 1570 parts of acetone and 60.1 parts of 1,2-naphthoquinone diazido-5-sulfonyl chloride were added, and the resulting mass was agitated thoroughly at room temperature. Into the resulting mixture, 26.7 parts of triethylamine were added dropwise over an hour, and reaction was continued for further two hours. The produced solution was filtered to remove impurities. The resulting mass was added dropwise over about one hour into a 20-fold quantity of well-agitated water and precipitated resins were recovered. After removal of the moisture under reduced pressure, a brownish cationic positive type photosensitive resin (A-5) was produced.

SYNTHESIS EXAMPLE 11

Synthesis of Anionic Positive Type Photosensitive Resin (A-6)

Synthesis of Anionic Resin (a-4)

1,000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 751 g of maleic anhydride, 10 g of xylene and 5.0 g of trimethyl hydroquinone, were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 480 mg KOH/g was produced.

Then, 500 g of the maleinated polybutadiene, 218 g of phenoxyethanol and 205 g of diethylene glycol dimethyl ether were charged into a 2 lit separable flask fitted with a reflux cooling tube, and dissolved homogeneously. Reaction was then carried out under nitrogen at 130° C. for three hours. Then, 61 g of benzylamine were added dropwise for 30 minutes at the same temperature and the temperature was raised to 165° C. Reaction was carried out at this temperature for seven hours to produce a solution of an anionic resin (a-4) containing half ester and imide groups.

Synthesis of Photosensitive Resin (a-5)

1000 g of "NISSEKI POLYBUTADIENE B-1000" (manufactures by NIPPON PETROCHEMICALS CO., LTD.; number average molecular weight, 1,000; iodine value, 430; content of 1,2-linkage, 65%), 388 g of maleic anhydride, 10 g of xylene and 3.0 g of trimethyl hydroquinone were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 320 mg KOH/g was produced.

Then, 500 g of the maleinated polybutadiene and 300 g of phenoxyethanol were charged into a 2 lit separable flask fitted with a thermometer, an agitator, a reflux cooling tube and a nitrogen blowing tube and dissolved homogeneously. Reaction was then carried out under nitrogen at 130° C. for three hours. After cooling to room temperature, 149 g of 2-(2-aminoethylamino)ethanol were added dropwise over an hour. The temperature was then raised to 125° C., at which temperature the reaction was carried out for four hours to produce a solution of polyamine resin containing imido groups.

Into a 5 lit separable flask fitted with a reflux cooling tube were charged 269 g of 1,2-naphthoquinone azido sulfonyl chloride, 1900 g of dioxane and 300 g of "KYOWAAD 1000" manufactured by KYOUWA CHEMICAL IND. Then, 645 g of the polyamine resin solution were added dropwise at 30° C. over two hours and reaction was carried out at this temperature further for five hours. After the produced solution was filtered, 440 g of phenoxy ethanol was added and dioxane was removed under reduced pressure to produce a photosensitive resin (a-5).

The produced resin (a-5) in solution contained 150 mg equivalent of naphthoquinone diazido groups per 100 g of resin, and the non-volatile content amounted to 60.0 wt. %.

Synthesis of Anionic Positive Type Photosensitive Resin (A-6)

750 g of the above mentioned (a-4) resin solution and 670 g of the photosensitive resin (a-5) solution were mixed thoroughly and 60 g of triethylamine was added for neutralization sufficiently to produce an anionic positive type photosensitive resin (A-6) solution.

SYNTHESIS EXAMPLE 12

Synthesis of Cationic Resin (A-7)

Synthesis of Amine-Added Epoxidated Polybutadiene (a-6)

1000 g of epoxidated liquid polybutadiene (manufactured by NIPPON PETROCHEMICALS CO., LTD. under the trade name of "E-1000-8"; number average molecular weight, 1000; oxirane content, 8%) were charged into a 2 lit separable flask fitted with a thermometer, an agitator and a reflux cooling pipe. After the atmosphere in the system was replaced by nitrogen, 231.2 g of methyl ethanol amine were added and reaction was carried out at 170° C. for five hours. Non-reacted methylethanol amine was distilled off to produce an amine-added epoxidated polybutadiene (a-6) having an amine value of 230.4 mmol/100 g.

Synthesis of Unsaturated Group-Containing Isocyanate (a-7)

Into a 2 lit round-bottomed flask, which might be heated and cooled, and which was fitted with a thermometer, an agitator, a reflux cooling pipe and a dropping funnel, 435.5 g of 2,4-tolylene diisocyanate and 266.1 g of diethylene glycol dimethyl ether were charged. After heated to 40° C., 362.8 g of 2-hydroxyethyl acrylate was added dropwise. Simultaneously, 200 ppm of p-benzoquinone was added. Since heat evolution was noticed by dropwise addition of 2-hydroxy ethyl acrylate, the system was cooled occasionally to maintain a constant temperature. After the end of dropwise addition of 2-hydroxy ethyl acrylate, the temperature was raised to 70° C., at which temperature the reaction was carried out for three hours. After confirming by IR absorption spectral analyses that absorption intensity of the isocyanate groups was reduced to about one half that before start of the reaction, the reaction system was cooled to produce an unsaturated group-containing isocyanate compound (a-7).

Synthesis of Cationic Resin (A-7)

500 g of (a-6) was dissolved in 166.7 g of diethylene glycol dimethyl ether in a 2 lit separable flask. 713.4 g of (a-7) (corresponding to 0.8 equivalent of the isocyanate groups to 1 equivalent of hydroxyl groups in (a-6)) were added dropwise to the resulting solution at 40° C., at which temperature the reaction was carried out for one hour. After confirming by IR absorption spectral analyses that absorption of the isocyanate groups disappeared, the reaction was terminated to obtain a cationic resin (A-7) which was an addition product of (a-7) to (a-6).

SYNTHESIS EXAMPLE 13

Preparation of Positive Type Photosensitive Coating (B-4)

500 g of the cationic positive type photosensitive resin (A-5) obtained in Synthesis Example 10, were dissolved in 333.3 g of methylethyl ketone. Into the mixture were added 11.7 g of acetic acid as a neutralizer and the resulting mass was again agitated sufficiently and homogenized. The resulting product was dispersed in water under gradual addition of deionized water and vigorous mixing by a high speed mixer, to produce an aqueous solution of a positive type photosensitive coating (B-4) (cationic electrodeposition type).

SYNTHESIS EXAMPLE 14

Preparation of Positive Type Photosensitive Coating (B-5)

500 g of the photosensitive resin (A-5) obtained in Synthesis Example 10 were dissolved in methylethyl ketone until the solid concentration reached 40 wt. % to produce a solution of a positive type photosensitive coating (B-5).

SYNTHESIS EXAMPLE 15

Preparation of Positive Type Photosensitive Coating (B-6)

To 500 g of the anionic positive type photosensitive resin (A-6) solution obtained in Synthesis Example 11, deionized water was added gradually and vigorously agitated by a high speed mixer to produce an aqueous solution of a positive type photosensitive coating (B-6) (anionic electrodeposition type) having a solid concentration of 15 wt. %.

SYNTHESIS EXAMPLE 16

Preparation of Colored coatings (C-7, C-8 and C-9)

Each solution of cationic resins (A-7), photopolymerization initiators and pigments were mixed together under agitation and the pigments were dispersed to have a pigment particle size of 0.2 μm or less by a laboratory 3-roll roll mill manufactured by KODAIRA SEISAKUSHO KK. Particle size was measured using a COULTER counter N4 manufactured by COULTER INC. Acetic acid as a neutralizer was added to each of the resulting dispersion mixtures and the resulting mass was again agitated sufficiently and homogenized. Each of the resulting products was dispersed in water under gradual addition of deionized water and under vigorous agitation by a high speed mixer, to produce colored coatings (C-7, C-8, C-9) each having a solids concentration of 10 wt. %. The compositions of the aqueous solutions of the produced three color colored coatings (cationic electrodeposition type) are shown in Table 3, wherein the numerals denote parts by weight.

TABLE 4

| Coating No. | C-7 | C-8 | C-9 |
|---|---|---|---|
| Color | Red | Green | Blue |
| Cationic resin (A-7) solution | 213.3 | 213.3 | 213.3 |
| IRGACURE 907 (*) | 11.5 | 11.5 | 11.5 |
| KAYACURE DETX (**) | 1.3 | 1.3 | 1.3 |
| Acetic acid (Neutralizer) | 19.8 | 19.8 | 19.8 |

TABLE 4-continued

| Coating No. | C-7 | C-8 | C-9 |
|---|---|---|---|
| Color | Red | Green | Blue |
| Phthalocyanine Blue (***) | — | — | 20 |
| Phthalocyanine Green (****) | — | 20 | — |
| Azo Metal Salt Red Pigment (*****) | 20 | — | — |

(*) IRGACURE 907", mfd. by CIBA GEIGY INC.
(**) KAYACURE DETX (mfd. by NIPPON KAYAKU CO., LTD.)
(***) Phthalocyanine Blue "SR-150C" (mfd. by SANYO SHIKISO KK)
(****) Phthalocyanine Green "SAX" (mfd. by SANYO SHIKISO KK)
(*****) Metal Salt Red Pigment "PIGMENT RED 4BS" (mfd. by SANYO SHIKISO KK)

EXAMPLE 1-1

Using a pyrex glass substrate, 1.1 mm in thickness, having an indium-tin oxide (ITO) film, 80 nm in thickness, on its surface, as a cathode, and using a stainless steel beaker containing an aqueous solution of a photosensitive coating (B-1), as an anode, electrodeposition was carried out for three minutes at 25° C. at a dc voltage of 30 V. After washing the glass substrate with ion-exchanged water followed by drying at 80° C. for 5 minutes and cooling, a non-tacky uniform coating film 2 μm in thickness was formed. A negative mask having light transmittance patterns of four different degrees of light transmittances, as shown in FIG. 2, was intimately contacted with the coating film and irradiated with UV rays of 200 mJ/cm², using a UV exposure device having a high pressure mercury lamp, manufactured by ORC MANUFACTURING CO., LTD. under the trade name of "JL-3300".

Then, after development with a 0.05 wt % aqueous solution of lactic acid, the photosensitive coating was selectively removed in a region thereof in register with the lowest transmittance negative mask region for exposing the ITO film. After washing with water and drying, electrodeposition was carried out for three minutes at a dc voltage of 25 V and a temperature of 25° C., using the glass substrate as an anode and a stainless steel beaker containing the colored coating (C-1) as a cathode. After washing the glass substrate with ion-exchanged water followed by drying at 80° C. for 5 minutes, a red colored layer, 2 μm in film thickness, not exhibiting tackiness at room temperature, was formed. After development with a 0.5 wt % aqueous solution of lactic acid, it was found that while no changes were noticed in the region of the photosensitive coating which was to be a light-intercepting film or in the red colored layer, the photosensitive coating was removed in a region thereof in register with the second lowest negative mask region.

After washing with water and drying, electrodeposition was carried out for three minutes at a dc voltage of 25 V and a temperature of 25° C., using a glass substrate as an anode and a stainless steel beaker containing the colored coating (C-2) as a cathode. After washing the glass substrate with ion-exchanged water, it was found that while no changes were noticed in the previously formed red colored layer or in the region of the photosensitive coating which was to be the light-intercepting film, a green colored layer was formed. After drying at 80° C. for 5 minutes followed by development with a 3.0 wt % aqueous solution of lactic acid, it was found that while no changes were noticed in the red colored layer or in the green colored layers, or in the region of the photosensitive coating which was to be the light-intercepting film, the photosensitive coating was removed in a region thereof in register with the third lowest light transmittance negative mask region.

Then, after washing with water and drying, electrodeposition was carried out for three minutes at a dc voltage of 25 V and a temperature of 25° C., using a glass substrate as an anode and a stainless steel beaker containing a colored coating (C-3) as a cathode. After washing the glass substrate with ion-exchanged water, it was found that while no changes were noticed in the previously formed red colored or green colored layer or in the region of the photosensitive coating film which was to be the light-intercepting film, a blue colored layer was formed. Then, after drying at 80° C. for five minutes followed by development with a 7.0 wt % aqueous solution of lactic acid, it was found that while no changes were seen in the colored layers, the residual photosensitive coating film which was to be the light-intercepting film was selectively removed. Using the ITO surface, laid to outside, as a cathode, electroplating was carried out for three minutes at a current density of 0.1 A/cm$^2$ in a Ni plating bath of 45° C. After washing with water and drying, a substrate having a light-intercepting Ni layer and the colored layers was produced.

For completing curing, baking was carried out at 175° C. for 30 minutes. After the curing, the color layers and the Ni layer were all 1.9 μm in thickness. A color filter having uniform colored layers excellent in transparency was obtained.

EXAMPLE 1-2

Using the same glass substrate as that used in Example 1-1 as an anode and also using a stainless steel beaker containing an aqueous solution of the photosensitive coating (B-2) as a cathode, electrodeposition was carried out for three minutes under conditions of a dc voltage of 25 V and a temperature of 25° C. After washing the glass substrate with ion-exchanged water followed by drying at 80° C. for five minutes, a non-tacky uniform coating film 1.8 μm in film thickness was formed.

A negative mask having light transmittance patterns of four different degrees of light transmittances as shown in FIG. 2 was then intimately contacted with the coating film and, using the UV exposure device employed in Example 1, irradiation was carried out with UV rays of 300 mJ/cm$^2$. After development with a 0.1 wt % aqueous solution of sodium carbonate, the photosensitive coating was selectively removed in a region thereof in register with the least light transmittance negative mask region, so that the ITO film was exposed.

After washing with water and drying, electrodeposition was carried out for three minutes under conditions of a dc voltage of 30 V and a temperature of 25° C., using the glass substrate as a cathode and a stainless steel beaker containing a colored coating (C-4) as an anode. After washing the glass substrate with ion-exchanged water followed by drying at 80° C. for five minutes, a red colored layer was formed. After development with a 0.75 wt % aqueous solution of sodium carbonate, it was found that while no changes were noticed in the red colored layer, the photosensitive coating was selectively removed in a region thereof in register with the second lowest light transmittance negative mask region.

Then, after washing with water and drying, electrodeposition was carried out for three minutes under conditions of a dc voltage of 30 V and a temperature of 25° C., using the glass substrate as a cathode and a stainless steel beaker containing the color coating (C-5) as an anode. After washing the glass substrate with ion-exchanged water, it was found that while no changes were noticed in the previously formed red colored layer, a green colored layer was formed. After washing the glass substrate with ion-exchanged water followed by development with a 5 wt % aqueous solution of sodium metasilicate, it was found that while no changes were noticed in the red and green colored layers, or in the photosensitive coating region which was to be the light-intercepting film, the photosensitive coating was selectively removed in a region thereof in register with the third lowest transmittance negative mask region.

Then, after washing with water and drying, electrodeposition was carried out for three minutes under conditions of a dc voltage of 30 V and a temperature of 25° C., using the glass substrate as a cathode and a stainless steel beaker containing the color coating (C-6) as an anode. After washing the glass substrate with ion-exchanged water, it was found that while no changes were noticed in the previously formed red colored layer, in the green colored layer or in the photosensitive film region which was to be the light-intercepting film, a blue colored layer was formed. After drying at 80° C. for five minutes and development with a 7.0 wt % aqueous solution of sodium metasilicate, it was found that while no changes were produced in the color layers, only the residual photosensitive coating film which was to be the light-intercepting film was selectively removed. Using the ITO surface exposed to outside as a cathode, electroplating was carried out for 2.5 minutes at a current density of 0.1 A/cm$^2$ in a Ni plating bath at 45° C. After washing with water and drying, a substrate having a non-light transmitting or light-intercepting Ni layer and the colored layers was produced.

For completing curing, baking was carried out at 175° C. for 30 minutes. After curing, the colored layers and the copper layer were all 1.8 μm in thickness. A color filter having uniform color layers with excellent transparency was produced.

EXAMPLE 1-3

The photosensitive coating solution (B-3) was spray coated on the same glass base plate as that used in Example 1-1 and air-dried. After drying at 80° C. for five minutes, a non-tacky coating film 1.9 μm in film thickness was obtained.

A negative mask having light transmittance patterns of four different degrees of light transmittances as shown in FIG. 2 was tightly contacted with the coating film and, using a UV exposure device having a high pressure mercury lamp, manufactured by ORC MANUFACTURING CO., LTD. under the tradename of "JL-3300", irradiation was carried out with UV rays of 200 mJ/cm$^2$. The subsequent development, electrodeposition and plating operations were carried out in the same manner as in Example 1-1 to produce a color filter having uniform colored layers with excellent transparency 1.9 μm in film thickness.

EXAMPLE 2-1

Using a pyrex glass substrate, 1.1 mm in thickness, having an indium-tin oxide (ITO), 80 nm in thickness, on its surface, referred to hereinafter as a master plate 1, as a cathode, and a stainless steel beaker containing an aqueous solution of a positive type photosensitive coating (B-4) as an anode, electrodeposition was carried out for 60 seconds under conditions of a dc voltage of 40 V and a temperature of 25° C. After washing the master plate 1 with ion-exchanged water followed by drying at 80° C. for five minutes and cooling, a non-tacky uniform coating film, 2 μm in film thickness, was formed.

A positive mask having light transmittance patterns of four different degrees of light transmittances as shown in FIG. 3 was intimately contacted with the coating film and, using a UV exposure device having a high pressure mercury lamp, manufactured by ORC MANUFACTURING CO., LTD. under the trade name of "JL-3300", the master plate 1 was irradiated with UV rays of 200 mJ/cm$^2$.

After development with a 0.3 wt % aqueous solution of sodium metasilicate, the positive type photosensitive coating was selectively removed in a region thereof in register with the maximum light transmittance positive mask region to expose the ITO film. After washing with water and drying, electrodeposition was carried out for three minutes under conditions of a dc voltage of 25 V and a temperature of 25° C., with the master plate 1 as an anode and with a stainless steel beaker containing the colored coating (C-1) as a cathode. After washing the master plate 1 with ion-exchanged water followed by drying at 80° C. for five minutes, a red-colored layer of 2 μm thickness not showing tackiness at room temperature was formed. After development with a 1.3 wt % aqueous solution of sodium metasilicate, it was found that while no changes were noticed in the red colored layer or in the positive type photosensitive coating region which was to be a light-intercepting film, the positive type photosensitive coating was selectively removed in a region thereof in register with the second highest transmittance positive mask region.

After washing with water and drying, electrodeposition was carried out for three minutes under conditions of a dc voltage of 25 V and a temperature of 25° C., with the master plate 1 as an anode and with a stainless steel beaker containing the colored coating (C-2) as a cathode. After washing the master plate 1 with ion-exchanged water, it was found that while no changes were seen in the previously formed red colored layer or in the positive type photosensitive coating region corresponding to the light-intercepting film, a green colored layer was formed. After drying at 80° C. for five minutes followed by development with a 3.0 wt % aqueous solution of sodium metasilicate, it was found that while no changes were produced in the red colored or green colored layer or in the positive type photosensitive coating region which was to be the light-intercepting film, the positive type photosensitive coating was selectively removed in a region thereof in register with the third highest light transmittance positive mask region.

After washing with water and drying, electrodeposition was carried out for three minutes under conditions of a dc voltage of 25 V and a temperature of 25° C., with the master plate 1 as an anode and a stainless steel beaker containing the color coating (C-3) as a cathode. After washing the master plate 1 with ion-exchanged water, it was found that while no changes were seen in the previously formed red colored or green colored layer or in the positive type photosensitive coating film region corresponding to the light-intercepting film, a blue colored layer was formed. Drying was carried out at 80° C. for five minutes.

After development with a 7.0 wt % aqueous solution of sodium metasilicate, no changes were noticed in the colored layers, while the photosensitive coating film was selectively removed in a region corresponding to the light-intercepting film. Using the ITO surface exposed to outside as a cathode, electroplating was carried out for three minutes at a current density of 0.1 A/cm$^2$ in a Ni plating bath of 45° C. After washing with water and drying, a master plate 2 having the non-transmitting (light-intercepting) Ni layer and the colored layers was produced.

Then, for completing curing, baking was carried out at 175° C. for 30 minutes. After curing, the colored layers and the Ni layer were all 1.9 μm in thickness, and a color filter having uniform colored layers excellent in transparency was produced.

EXAMPLE 2-2

Using the same glass substrate as that used in Example 2-1, referred to hereinafter as a master plate 3, as an anode, and a stainless steel beaker containing an aqueous solution of a positive type photosensitive coating (B-6) as a cathode, electrodeposition was carried out for two minutes under conditions of a dc voltage of 45 V and a temperature of 25° C. After washing the master plate 3 with ion-exchanged water and drying at 80° C. for five minutes, a non-tacky uniform coating film 1.8 μm in film thickness was produced.

A positive mask having light transmittance patterns having four different degrees of light transmittances as shown in FIG. 3 was tightly contacted with the coating film and, using a UV exposure device employed in Example 2-1, the master plate 3 was irradiated with UV rays of 200 mJ/cm$^2$. After development with a 0.1 wt % aqueous solution of sodium carbonate, the positive photosensitive coating was selectively removed in a region in register with the maximum light transmittance positive mask region to expose the ITO film.

After washing with water and drying, electrodeposition was carried out for three minutes under conditions of a dc voltage of 30 V and a temperature of 25° C., using the master plate 3 as a cathode and a stainless steel beaker containing the colored coating (C-7) as an anode. After washing with ion-exchanged water followed by drying at 80° C. for five minutes, a red colored layer was formed. After development with a 1.5 wt % aqueous solution of sodium metasilicate, it was found that while no changes were seen in the red colored layer, the positive photosensitive coating was selectively removed in a region thereof in register with the second highest transmittance positive mask region.

After washing with water and drying, electrodeposition was carried out for three minutes under conditions of a dc voltage of 30 V and a temperature of 25° C., using the master plate 3 as a cathode and a stainless steel beaker containing the colored coating (C-8) as an anode. After washing the master plate 3 with ion-exchanged water, it was found that while no changes were produced in the previously formed red colored layer, a green colored layer was formed. After drying at 80° C. for five minutes followed by development with a 4 wt % aqueous solution of sodium metasilicate, it was found that while no changes were seen in the red colored or green colored layer, or in the positive type photosensitive coating region which was to be a light-intercepting film, the positive photosensitive coating region in register with the third highest light transmittance positive mask region was selectively removed.

After washing with water and drying, electrodeposition was carried out for three minutes under conditions of a dc voltage of 30 v and a temperature of 25° C., using the master plate 3 as a cathode and a stainless steel beaker containing the colored coating (C-9) as an anode. After washing the master plate 3 with ion-exchanged water, it was found that while no changes were seen in the previously formed red colored or green colored layer or in the positive type photosensitive coating region corresponding to the light-intercepting layer, a blue colored layer was formed. Drying was then carried out at 80° C. for five minutes.

After development with a 7.0 wt % aqueous solution of sodium metasilicate, it was found that while no changes were noticed in the colored layers, only the photosensitive coating film was selectively removed in a region corresponding to the light-intercepting film. Using the ITO surface exposed to outside as a cathode, electroplating was carried out for three minutes at a current density of 0.1 A/cm$^2$ in a copper plating bath at 45° C. After washing with water and drying, master plate 3 having a non-light transmitting or light-intercepting copper layer and the colored layers was produced.

For completing curing, baking was carried out at 175° C. for 30 minutes. After curing, the colored layers and the copper layer were all 1.8 μm in thickness. A color filter having the uniform colored layers excellent in transparency was produced.

EXAMPLE 2-3

The positive type photosensitive coating solution (B-5) was coated by spin coating on the same substrate as that used in Example 2-1 and air-dried. After drying at 80° C. for five minutes, a non-tacky uniform coating film 1.9 μm in film thickness was formed.

The positive mask shown in FIG. 3 was tightly contacted with the coating film surface and, using a UV exposure device having a high pressure mercury lamp, manufactured by ORC MANUFACTURING CO., LTD. under the trade name of "JL-3300", the substrate was irradiated with UV rays of 200 mJ/cm$^2$. The development, electrodeposition and plating operations were carried out in the same manner as in Example 2-1 to produce a color filter having uniform colored layers with excellent transparency having a film thickness of 1.9 μm.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a color filter comprising the steps of:
   (A) forming a photosensitive coating film on a transparent electrically conductive layer formed on a surface of a transparent substrate and exposing said photosensitive coating film through a mask having patterns of at least three different degrees of light transmittances;
   (B) developing and removing a photosensitive coating film region corresponding to a pattern selected from the group consisting of a pattern having the smallest degree of light transmittance and a pattern having the largest degree of light transmittance for exposing said transparent electrically conductive layer and electrodepositing a colored coating on the exposed transparent electrically conductive layer for forming a colored layer thereon, operation of developing and removing the photosensitive coating film and electrodepositing the colored coating being repeated for the respective patterns having different degrees of light transmittances in one sequence selected from the group consisting of increasing light transmittance and decreasing light transmittance to form different colored layers, respectively; and
   (C) selectively forming a metal layer on at least one exposed region of said transparent electrically conductive layer.

2. A method as claimed in claim 1 wherein a material of said transparent electrically conductive layer is selected from the group consisting of tin oxide, indium oxide, antimony oxide and mixtures thereof.

3. A method as claimed in claim 1 wherein said photosensitive coating film is formed by a method selected from the group consisting of electrodeposition, spraying, dip coating, roll coating, screen printing and spin coating.

4. A method as claimed in claim 1 wherein said photosensitive coating film is formed of a negative photosensitive coating containing a negative photosensitive coating resin exhibiting coating film forming capability and photosensitivity, a photopolymerization initiator and a solvent selected from the group consisting of an organic solvent and water.

5. A method as claimed in claim 4 wherein said negative photosensitive coating resin has a molecular weight ranging between 500 and 10,000.

6. A method as claimed in claim 4 wherein said negative photosensitive coating resin is a prepolymer selected from the group consisting of epoxy (meth)acrylate, urethane (meth)acrylate, polyester (meth)acrylate and mixtures thereof.

7. A method as claimed in claim 4 wherein said negative photosensitive coating resin is a cationic resin prepared by introducing (i) a member selected from the group consisting of an amino group, an ammonium group, a sulfonium group, and mixtures thereof and (ii) a photosensitive group into a main resin and neutralizing with an acidic material, said main resin being selected from the group consisting of acrylic resin, polyester resin, maleinated oil resin, epoxy resin, urethane resin, polybutadiene resin, polyamide resin and mixtures thereof, said photosensitive group being selected from the group consisting of an acryloyl group, a methacryloyl group, a cinnamoyl group and mixtures thereof, and said acidic material being selected from the group consisting of formic acid, acetic acid, propionic acid, lactic acid and mixtures thereof.

8. A method as claimed in claim 4 wherein said negative photosensitive coating resin is a carboxyl group-containing anionic resin obtained by introducing a carboxyl group and a photosensitive group into a main resin and neutralizing with a basic substance, said main resin being selected from the group consisting of acrylic resin, polyester resin, maleinated oil resin, polybutadiene resin, epoxy resin, urethane resin, polyamide resin and mixtures thereof, said photosensitive group being selected from the group consisting of an acryloyl group, a methacryloyl group, a cinnamoyl group and mixtures thereof, said basic substance being selected from the group consisting of triethylamine, diethylamine, dimethylethanol amine, ammonia and mixtures thereof.

9. A method as claimed in claim 4 wherein said photopolymerization initiator is selected from the group consisting of benzoins, benzoin ethers, benzilalkyl ketals, benzophenone, anthraquinone, thioxathone and mixtures thereof.

10. A method as claimed in claim 4 wherein an added amount of said photopolymerization initiator is 0.1 to 30 parts by weight to 100 parts by weight of said negative photosensitive coating resin.

11. A method as claimed in claim 4 wherein said organic solvent is selected from the group consisting of ethyleneglycol monobutyl ether, ethyleleglycol monohexyl ether, ethyleneglycol monophenyl ether, propyleneglycol monomethyl ether, propylneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethyl formamide, N,N-dimethyl acetoamide, dimethyl sulfoxide and mixtures thereof.

12. A method as claimed in claim 4 wherein said negative photosensitive coating contains a colorant selected from the group consisting of dyes, pigments and mixtures thereof.

13. A method as claimed in claim 12 wherein said dye is selected from the group consisting of azo dyes, anthraquinone dyes, benzodifuranone dyes, condensed methine dyes and mixtures thereof.

14. A method as claimed in claim 12 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

15. A method as claimed in claim 12 wherein said colorant is used in an amount of 3 to 70 wt. % based on a total amount of the negative type photosensitive coating.

16. A method as claimed in claim 1 wherein said photosensitive coating film is formed of a positive photosensitive coating containing a positive photosensitive coating resin having coating film forming capability and photosensitivity and a solvent selected from the group consisting of an organic solvent and water.

17. A method as claimed in claim 16 wherein said positive photosensitive coating resin is a quinone diazido group containing cationic resin obtained by introducing (i) a member selected from the group consisting of an amino group, an ammonium group, a sulfonium group, and mixtures thereof, and (ii) a hydroxyl group into a main resin, adding a quinone diazido sulfonic acid compound by esterification reaction and neutralizing with an acidic material, said main resin being selected from the group consisting of acrylic resin, polyester resin, maleinated oil resin, polybutadiene resin, epoxy resin, urethane resin, polyamide resin and mixtures thereof, and said acid material being selected from the group consisting of formic acid, acetic acid, propionic acid, lactic acid, and mixtures thereof.

18. A method as claimed in claim 16 wherein said positive photosensitive coating resin is a quinone diazido group-containing anionic resin obtained by introducing a carboxyl group and a hydroxyl group into a main resin, adding a quinone diazido sulfonic acid compound by esterification reaction and neutralization with a basic substance, said main resin being selected from the group consisting of acrylic resin, polyester resin, maleinated oil resin, polybutadiene resin, epoxy resin, urethane resin, polyamide resin and mixtures thereof, and said basic substance being selected from the group consisting of triethylamine, diethylamine, dimethylethanol amine, ammonia and mixtures thereof.

19. A method as claimed in claim 16 wherein said positive photosensitive coating resin is a quinone diazido group-containing resin obtained by reacting a resin having film forming capability and a hydroxyl group-containing compound with a quinone diazido compound, said quinone diazido compound being selected from the group consisting of a quinone diazido sulfonic acid derivative-containing quinone diazido compound and an isocyanate group-containing quinone azido compound.

20. A method as claimed in claim 16 wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethylformamide, N,N-dimethyl acetoamide, dimethyl sulfoxide and mixtures thereof.

21. A method as claimed in claim 16 wherein said positive photosensitive coating contains a colorant selected from the group consisting of dyes, pigments and mixtures thereof.

22. A method as claimed in claim 21 wherein said dye is selected from the group consisting of azo dyes, anthraquinone dyes, benzodifuranone dyes, condensed methine dyes and mixtures thereof.

23. A method as claimed in claim 21 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

24. A method as claimed in claim 21 wherein 3 to 70 wt. % of said colorant is contained based on total weight of said positive photosensitive coating.

25. A method as claimed in claim 1 wherein said mask is a negative mask and wherein said sequence is in an order of increasing light transmittances.

26. A mask as claimed in claim 1 wherein said mask is a positive mask and wherein said sequence is in an order of decreasing light transmittances.

27. A method as claimed in claim 1 wherein said photosensitive coating film is developed and removed by a developing solution selected from the group consisting of an aqueous solution containing an acidic material dissolved therein, an aqueous solution containing a basic material dissolved therein, alcohols, glycol ethers, ketones and chlorinated hydrocarbons.

28. A method as claimed in claim 27 wherein said acidic material is selected from the group consisting of formic acid, acetic acid, propionic acid, lactic acid, hydrochloric acid, phosphoric acid and mixtures thereof.

29. A method as claimed in claim 27 wherein said basic material is selected from the group consisting of sodium carbonate, sodium hydrogen carbonate, sodium metasilicate, tetraalkyl ammonium hydroxide, sodium hydroxide, potassium hydroxide and mixtures thereof.

30. A method as claimed in claim 1 wherein said photosensitive coating film is developed and removed under conditions of a temperature of 10° to 70° C. and a developing time of 5 to 600 seconds.

31. A method as claimed in claim 1 wherein said colored coating is obtained by neutralizing a film-forming component and a colorant component with a material selected from the group consisting of an acidic substance and a basic substance, said film-forming component being selected from the group consisting of cationic resins, anionic resins and photocurable resins, said colorant component being selected from the group consisting of dyes, pigments and mixtures thereof, said acidic substance being selected from the group consisting of formic acid, acetic acid, propionic acid, lactic acid and mixtures thereof, and said basic substance being selected from the group consisting of triethylamine, diethylamine, diethylethanol amine, ammonia and mixtures thereof.

32. A method as claimed in claim 31 wherein said cationic resin is obtained by introducing (i) a member selected from the group consisting of an amino group, an ammonium group, a sulfonium group, and mixtures thereof into a main resin, said main resin being selected from the group consisting of acrylic resin, polyester resin, maleinated oil resin, epoxy resin, urethane resin, polybutadiene resin, polyamide resin and mixtures thereof.

33. A method as claimed in claim 31 wherein said anionic resin is obtained by introducing a carboxyl group into a main resin selected from the group consisting of acrylic resin, polyester resin, maleinated oil resin, polybutadiene resin, epoxy resin, urethane resin, polyamide resin and mixtures thereof.

34. A method as claimed in claim 31 wherein said photocurable resin contains a functional group selected from the group consisting of an acryloyl group, a methacryloyl group, a cinnamoyl group and mixtures thereof in a molecule thereof.

35. A method as claimed in claim 31 wherein said photocurable resin comprises a photopolymerization initiator selected from the group consisting of benzoins, benzoin ethers, benzilalkyl ketals, benzophenone, anthraquinone, thioxanthone and mixtures thereof.

36. A method as claimed in claim 31 wherein said dye is selected from the group consisting of azo dyes, anthraquinone dyes, benzodifuranone dyes, condensed methine dyes and mixtures thereof.

37. A method as claimed in claim 31 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

38. A method as claimed in claim 1 wherein said colored coating is electrodeposited at an electrical voltage of 5 to 500 V dc for a time interval of 5 to 300 seconds and at a liquid temperature of 10° to 35° C.

39. A method as claimed in claim 1 wherein said metal layer is formed on an exposed region registering with that portion other than said patterns of different degrees of light transmittances of said mask.

40. A method as claimed in claim 1 wherein a metal used as said metal layer is selected from the group consisting of copper, nickel, chromium, silver, gold, an alloy thereof and mixtures thereof.

41. A method as claimed in claim 1 further comprising a step of curing said colored layers by heating at 100° to 250° C. for 5 minutes to one hour after said step (C) is performed.

42. A method as claimed in claim 1 further comprising a step of photocuring said colored layers after said step (C) is performed.

* * * * *

UNITED STATES PATENT AND TRADEMARK OFFICE
CERTIFICATE OF CORRECTION

PATENT NO.   :   5,314,769
DATED        :   May 24, 1994
INVENTOR(S)  :   Yukio Yamasita et al.

It is certified that error appears in the above-indentified patent and that said Letters Patent is hereby corrected as shown below:

In column 27, line 2, please change "thioxathone" to -- thioxanthone --.

In column 27, line 10, please change "ethyleleglycol" to -- ethyleneglycol --.

In column 27, line 12, please change "propylneglycol" to -- propyleneglycol --.

In column 28, line 21, please change "ethylglycol" to -- ethyleneglycol --.

Signed and Sealed this

Eighteenth Day of October, 1994

Attest:

BRUCE LEHMAN

*Attesting Officer*        *Commissioner of Patents and Trademarks*